(12) United States Patent
Laufer et al.

(10) Patent No.: US 9,134,504 B2
(45) Date of Patent: Sep. 15, 2015

(54) OPTICAL ARRANGEMENT IN AN OPTICAL SYSTEM, IN PARTICULAR IN A MICROLITHOGRAPHIC PROJECTION EXPOSURE APPARATUS

(75) Inventors: Timo Laufer, Stuttgart (DE); Alexander Sauerhoefer, Hamburg (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 717 days.

(21) Appl. No.: 13/370,989

(22) Filed: Feb. 10, 2012

(65) Prior Publication Data
US 2012/0154772 A1 Jun. 21, 2012

Related U.S. Application Data

(63) Continuation of application No. PCT/EP2010/063999, filed on Sep. 22, 2010.

(60) Provisional application No. 61/247,090, filed on Sep. 30, 2009.

(30) Foreign Application Priority Data

Sep. 30, 2009 (DE) .......................... 10 2009 045 193

(51) Int. Cl.
*G03B 27/52* (2006.01)
*G03B 27/54* (2006.01)
(Continued)

(52) U.S. Cl.
CPC .......... *G02B 7/1815* (2013.01); *G03F 7/70891* (2013.01)

(58) Field of Classification Search
CPC .............. G03F 7/7015; G03F 7/70166; G03F 7/70175; G03F 7/70858; G03F 7/70883; G03F 7/70891; G03F 7/70958; G02B 7/181; G02B 7/1815

USPC ............ 355/30, 67–71, 77; 250/492.1, 492.2, 250/492.22, 548; 430/5, 8, 22, 30, 311, 430/312, 321
See application file for complete search history.

(56) References Cited

U.S. PATENT DOCUMENTS

| 3,781,733 A | 12/1973 | Heim |
| 5,909,308 A | 6/1999 | Ulrich |

(Continued)

FOREIGN PATENT DOCUMENTS

| DE | 102 33 828 | 2/2004 |
| DE | 10 2007 052 885 | 5/2008 |

(Continued)

OTHER PUBLICATIONS

Japanese Office Action, with translation thereof, for corresponding JP Appl No. 2012-530253 dated Jul. 18, 2013.

(Continued)

*Primary Examiner* — Christina Riddle
(74) *Attorney, Agent, or Firm* — Fish & Richardson P.C.

(57) ABSTRACT

An optical arrangement in an optical system, such as a microlithographic projection exposure apparatus, includes: at least one heat-emitting subsystem which emits heat during the operation of the optical system; a first heat shield which is arranged such that it at least partly absorbs the heat emitted by the heat-emitting subsystem; a first cooling device which is in mechanical contact with the first heat shield and is designed to dissipate heat from the first heat shield; and a second heat shield which at least partly absorbs heat emitted by the first heat shield. The second heat shield is in mechanical contact with a cooling device that dissipates heat from the second heat shield.

23 Claims, 13 Drawing Sheets

(51) Int. Cl.
*G02B 7/18* (2006.01)
*G03F 7/20* (2006.01)
*G03B 27/72* (2006.01)

(56) References Cited

U.S. PATENT DOCUMENTS

| | | | |
|---|---|---|---|
| 6,509,951 | B2 | 1/2003 | Loopstra et al. |
| 7,212,274 | B2 | 5/2007 | Hara et al |
| 2001/0013925 | A1* | 8/2001 | Loopstra et al. ............... 355/30 |
| 2002/0027644 | A1* | 3/2002 | Bisschops ...................... 355/30 |
| 2004/0035570 | A1* | 2/2004 | Hara ............................ 165/289 |
| 2004/0051984 | A1* | 3/2004 | Oshino et al. ................. 359/845 |
| 2004/0184014 | A1* | 9/2004 | Bakker et al. .................. 355/30 |
| 2005/0018154 | A1 | 1/2005 | Box et al. |
| 2005/0122490 | A1* | 6/2005 | Luttikhuis et al. .............. 355/30 |
| 2005/0128446 | A1 | 6/2005 | Miyajima |
| 2005/0207001 | A1 | 9/2005 | Laufer et al. |
| 2008/0144202 | A1 | 6/2008 | Wevers et al. |
| 2010/0025600 | A1* | 2/2010 | Chavez et al. ............ 250/504 R |

FOREIGN PATENT DOCUMENTS

| | | | |
|---|---|---|---|
| EP | 0 783 121 | A2 | 7/1997 |
| EP | 1124160 | | 8/2001 |
| EP | 1 387 054 | A2 | 2/2004 |
| JP | 2001-244196 | A | 9/2001 |
| JP | 2004-080025 | | 3/2004 |
| JP | 2005-109158 | A | 4/2005 |
| JP | 2005-175187 | A | 6/2005 |
| JP | 2006-173245 | A | 6/2006 |
| JP | 2008-103545 | A | 5/2008 |
| JP | 2009-010174 | A | 1/2009 |
| JP | 2009-037391 | A | 2/2009 |
| JP | 2009-170793 | A | 7/2009 |

OTHER PUBLICATIONS

Korean Office Action, with English translation, for corresponding KR Appl No. 10-2012-7010772, dated Jul. 30, 2013.
International Preliminary Report on Patentability for corresponding PCT Appl No. PCT/EP2010/063999, dated Apr. 12, 2012.
German Office Action, with English translation, for corresponding DE Application No. 10 2009 045 193.5-51, dated Jul. 7, 2010.
International Search Report and Written Opinion for corresponding PCT Appl No. PCT/EP2010/063999, dated Mar. 22, 2011.
Chinese Office Action, with translation thereof, for corresponding CN Appl No. 2010800437668, dated Nov. 13, 2013.
Taiwanese Office Action and Search Report, with translation thereof, for TW Appl No. 099133057, dated Apr. 28, 2015.

* cited by examiner

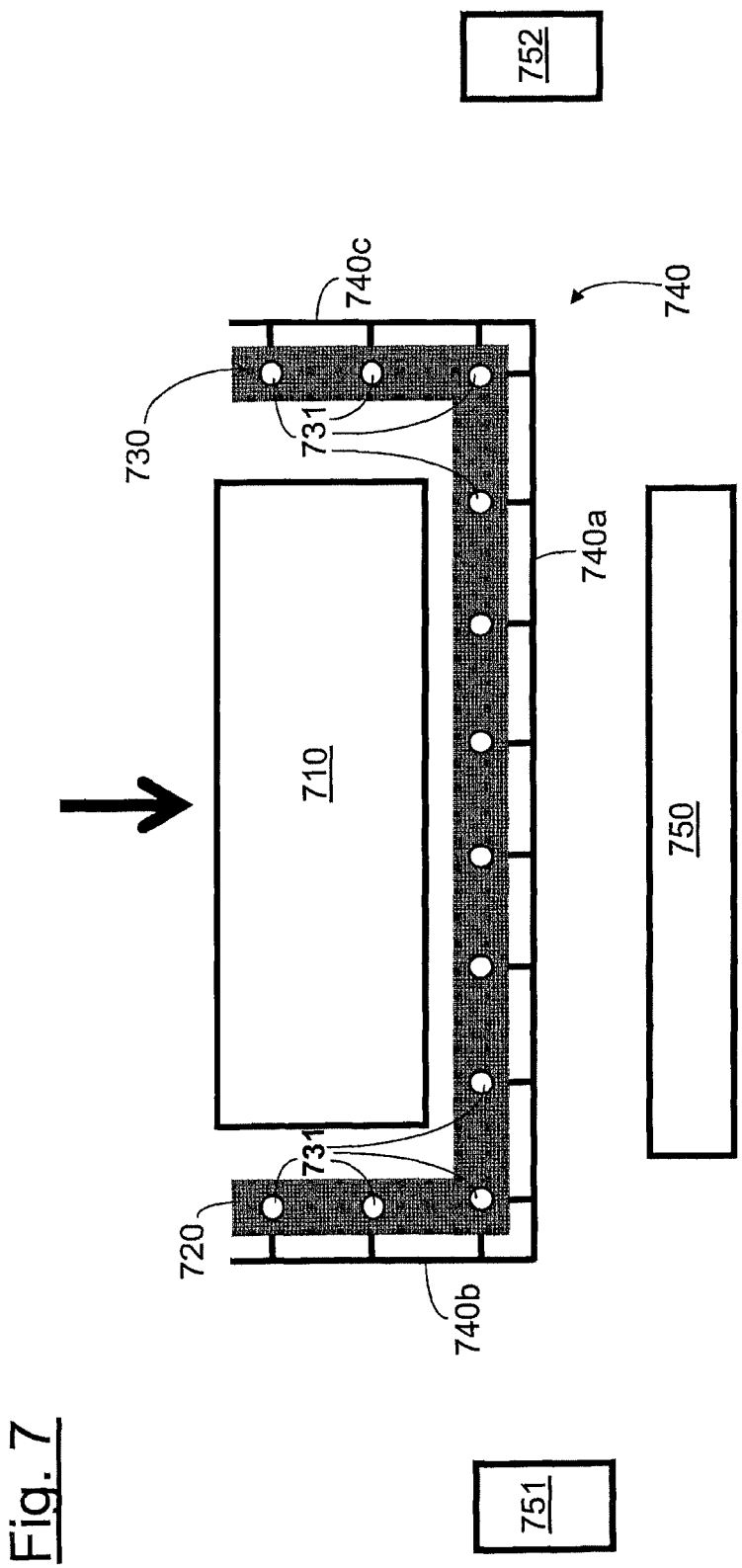

OPTICAL ARRANGEMENT IN AN OPTICAL SYSTEM, IN PARTICULAR IN A MICROLITHOGRAPHIC PROJECTION EXPOSURE APPARATUS

CROSS REFERENCE TO RELATED APPLICATIONS

This application is a continuation of, and claims priority under 35 U.S.C. 120 to, international patent application serial number PCT/EP2010/063999, filed Sep. 22, 2010, which claims priority under 35 USC 119 to German patent application serial number 10 2009 045 193.5, filed on Sep. 30, 2009, and priority under 35 USC 119(e)(1) to U.S. provisional application No. 61/247,090, filed on Sep. 30, 2009. These applications are hereby incorporated by reference in their entirety.

FIELD

The disclosure relates to an optical arrangement in an optical system, in particular in a microlithographic projection exposure apparatus.

BACKGROUND

Microlithography is used for producing microstructured components such as, for example, integrated circuits or LCDs. The microlithography process is carried out in a so-called projection exposure apparatus having an illumination device and a projection objective. The image of a mask (=reticle) illuminated via the illumination device is projected via the projection objective onto a substrate (e.g. a silicon wafer, that is coated with a light-sensitive layer (photoresist) and arranged in the image plane of the projection objective, in order to transfer the mask structure to the light-sensitive coating of the substrate.

During the operation of optical systems such as, for instance, the projection exposure apparatus described above, particularly in the case of globally or locally high thermal loads, absorption of high thermal loads can increase the temperature of temperature-sensitive components (such as e.g. mirrors, lenses or mount elements) or other (sub)systems, which can impair the imaging properties of the optical system.

One example of this is the impairment of temperature-sensitive elements present in the optical system, such as e.g. position sensors, or of temperature-sensitive subsystems in the imaging beam path of the projection exposure apparatus described above.

Thus, for instance, in projection objectives designed for the EUV range (that is to say at wavelengths of less than 15 nm, e.g. approximately 13.5 nm), wherein, owing to a general lack of availability of suitable light-transmissive refractive materials, mirrors are used as optical components for the imaging process, it is known to provide, in addition to a carrying structure that carries mirrors and mirror actuators, a measuring structure, which is typically arranged outside the carrying structure and which is intended to ensure a thermally as well as mechanically stable fixing of position sensors or other measuring systems for determining the mirror positions. Undesired heating of the measuring structure is serious due to the relatively small (e.g., approximately 1 mm to 100 mm) distance between the position sensors and the mirrors that heat up during the operation of the projection exposure apparatus.

US 2005/0018154 A1 discloses a microlithographic projection exposure apparatus which includes at least one heat shield intended to absorb the heat emitted by the mirrors and/or the carrying structure thereof such that the heat is dissipated by a heat transfer circuit that is in mechanical contact with the heat shield.

SUMMARY

The disclosure provides an optical arrangement in an optical system, in particular in a microlithographic projection exposure apparatus, which allows effective protection of temperature-sensitive components against undesired heat input.

An optical arrangement according to the disclosure in an optical system, in particular in a microlithographic projection exposure apparatus, includes: at least one heat-emitting subsystem which emits heat during the operation of the optical system; a first heat shield arranged such that it at least partly absorbs the heat emitted by the heat-emitting subsystem; a first cooling device in mechanical contact with the first heat shield and designed to dissipate heat from the first heat shield; and a second heat shield which at least partly absorbs heat emitted by the first heat shield. The second heat shield is in mechanical contact with a cooling device that dissipates heat from the second heat shield.

The heat-emitting subsystem can be e.g. an individual element, e.g. an optical element, in particular a mirror, or a mount element. The term "optical element" as used herein encompasses any optical elements, in particular also refractive elements (such as e.g. lenses or prisms), beam splitters or gratings.

However, the disclosure is not restricted thereto, and so any other heat source can also be involved. Furthermore, the subsystem can also have a plurality of optical elements, which are then regarded overall as a heat source, such as e.g. the illumination system of the projection exposure apparatus described above, or any other subsystem. In particular, the projection objective of the projection exposure apparatus can be protected against heat input on the part of the heat-emitting illumination device insofar as the imaging beam path in the projection objective can be kept free as much as possible from temperature fluctuations and impairment of the imaging properties can be at least substantially avoided.

The disclosure is based on the concept, in particular, of providing a second heat shield in addition to a first heat shield. In this way, temperature-sensitive components to be protected such as e.g. position sensors or other temperature-sensitive subsystems to be protected such as e.g. the imaging beam path of the projection exposure apparatus described above are shielded from temperature inhomogeneities that are typically still present in the region of the first heat shield insofar as any residual heat possibly still remaining on the second heat shield as a result of heat emission from the first heat shield is either negligible or at least significantly reduced by comparison with the residual heat present on the first heat shield. Besides the reduction of the residual heat, a further desired effect of the arrangement according to the disclosure in this case involves homogenization (in the sense of a uniform distribution) of the temperature on the second heat shield.

By virtue of the fact that the second heat shield, for its part, is likewise in mechanical contact with a cooling device, which can be one and the same cooling device or a separate cooling device and dissipates the heat from the second heat shield, transfer of possible temperature inhomogeneities still present on the second heat shield to the temperature-sensitive components to be protected is at least substantially avoided.

This also takes account of the circumstance that the thermal conductance of the second heat shield (just like the thermal conductance of the first heat shield) is generally significantly higher than the thermal conductance of the gas (e.g. air or a suitable purge gas such as e.g. hydrogen) present in the optical system, such that in the absence of thermal contact between the second heat shield and a cooling device, the thermal resistance of the heat on its way to temperature-sensitive components present would be reduced in an undesirable manner.

In particular, protection of temperature-sensitive components or systems against temperature fluctuations can be achieved with the optical arrangement according to the disclosure. Typical values for the temperature fluctuations of temperature-sensitive components that are still permissible in a microlithographic projection exposure apparatus, such as are realized via the present disclosure, can in this case be less than 500 µK/min, in particular less than 100 µK/min, more particularly less than 40 µK/min, and more particularly less than 10 µK/min.

Besides the shielding described above, a further function performed by the arrangement according to the disclosure can include a cooling function insofar as the received heat that emerges from the heat-emitting subsystem and is absorbed by the heat shield is dissipated toward the outside. By way of example, excessive heating e.g. of the mirrors in a projection exposure apparatus and associated impairments of the coatings present on the mirrors can be avoided in this way.

With the arrangement according to the disclosure, the proportion of heat that passes from the heat-emitting subsystem as far as the temperature-sensitive element can be reduced by approximately one order of magnitude, for example, in comparison with a conventional (simple or single-stage) heat shield. Thus, for instance, compared with a conventional single-stage system having an exemplary ratio of 1:10 between the heat transmitted toward the temperature-sensitive element and the heat shielded away from the temperature-sensitive element, depending on the embodiment, it is possible to effect an increase to a ratio of 1:100 in terms of order of magnitude.

In accordance with one embodiment, the second heat shield is not in mechanical or physical contact with the first heat shield or is in mechanical or physical contact with the first heat shield only in the region of the first cooling device.

In accordance with one embodiment, the cooling device that is in mechanical contact with the second heat shield is a second cooling device separate from the first cooling device. In this case, the first and the second cooling devices can be connected to different cooling circuits, which is advantageous with regard to the thermal stability of the cooling medium in particular for the second heat shield, since the cooling medium is not heated directly by the first heat shield.

In accordance with a further embodiment, the cooling device that is in mechanical contact with the second heat shield is the first cooling device, that is to say that both heat shields are connected to one and the same cooling device or the same cooling circuit. This configuration is advantageous with regard to the more compact design that is possible as a result, and hence the saving of structural space.

In accordance with one embodiment, the arrangement has at least three heat shields, in particular at least four heat shields. This configuration makes it possible, as also illustrated hereinafter, to achieve even more effective absorption of the heat or temperature distribution originating from the heat-emitting subsystem.

In accordance with one embodiment, at least one of the heat shields, in particular all of the heat shields, has/have, at least in regions, a first coating, which has emissivity of at most 0.5, in particular at most 0.2, more particularly at most 0.05, that is adapted to the cooler temperature or for the wavelength of the heat emitted by the heat-emitting subsystem. The first coating can be arranged at least on that side of the relevant heat shield which faces away from the heat-emitting subsystem or faces a component to be protected (e.g. a sensor). A further reduction of the temperature distribution that passes as far as the component to be protected or is externally visible and originates from the heating of the heat-emitting subsystem can be achieved in this way.

In accordance with one embodiment, the first heat shield has, at least in regions, a second coating, which has an emissivity of at least 0.5, in particular at least 0.8, more particularly at least 0.95, for the wavelength of the heat emitted by the heat-emitting subsystem. The second coating can be arranged, in particular, at least on that side of the first heat shield which faces the heat-emitting subsystem.

In accordance with one embodiment, that side of the heat shield which faces the heat-emitting subsystem can have, at least in regions, a coating that reduces the emissivity for the wavelength of the heat emitted by the heat-emitting subsystem, in particular of at most 0.5, or at most 0.2, or in particular at most 0.05.

In accordance with one embodiment, the heat shields can form at least one partial housing with an atmosphere that differs from the surroundings of the arrangement. The medium in the closed-off housing or partial housing preferably has a poorer thermal conductivity than the medium in the surrounding atmosphere. The medium having a poorer thermal conductivity can be a low-pressure gas, for example. This configuration makes it possible to achieve even more effective absorption of the heat or temperature distribution originating from the heat-emitting subsystem.

In accordance with one embodiment, the second heat shield has a geometry corresponding to the first heat shield. In particular, the first heat shield can surround the heat-emitting subsystem in a box- or hood-like manner at least in regions. Furthermore, the second heat shield can surround the first heat shield in a box- or hood-like manner at least in regions. Such a configuration makes it possible to achieve even more effective absorption of the heat emitted by the heat-emitting subsystem, that is to say a further reduction of the externally visible temperature distribution caused by the heating of the heat-emitting subsystem, to be precise in particular in situations in which not just one but a plurality of temperature-sensitive components are present at different positions in the optical system and are to be protected against thermal influences.

In accordance with another embodiment, the first heat shield can also surround a temperature-sensitive subsystem (in particular a temperature-sensitive element) in a box- or hood-like manner at least in regions. Such a configuration is advantageous, for example, if a plurality of (in particular widely spread) heat sources or one or a plurality of—relative to the temperature-sensitive component—comparatively large heat sources or heat-emitting subsystems are present.

In accordance with one embodiment, the heat shields are arranged in a cascade-like manner.

In accordance with one embodiment, the optical arrangement is designed for an operating wavelength of less than 400 nm, in particular less than 250 nm, more particularly less than 200 nm, more particularly less than 160 nm, and more particularly less than 15 nm.

The disclosure furthermore relates to a microlithographic projection exposure apparatus including an illumination device and a projection objective, the illumination device and/or the projection objective having an optical arrangement according to the disclosure including the features described above, and also to a method for the microlithographic production of microstructured components.

Further configurations of the disclosure can be gathered from the description and also the dependent claims.

BRIEF DESCRIPTION OF THE DRAWINGS

The disclosure will be explained in greater detail below on the basis of exemplary embodiments illustrated in the accompanying figures, in which:

FIGS. 2a-8b show schematic illustrations for elucidating further embodiments of the present disclosure;

DETAILED DESCRIPTION OF PREFERRED EMBODIMENTS

Figure 1A:
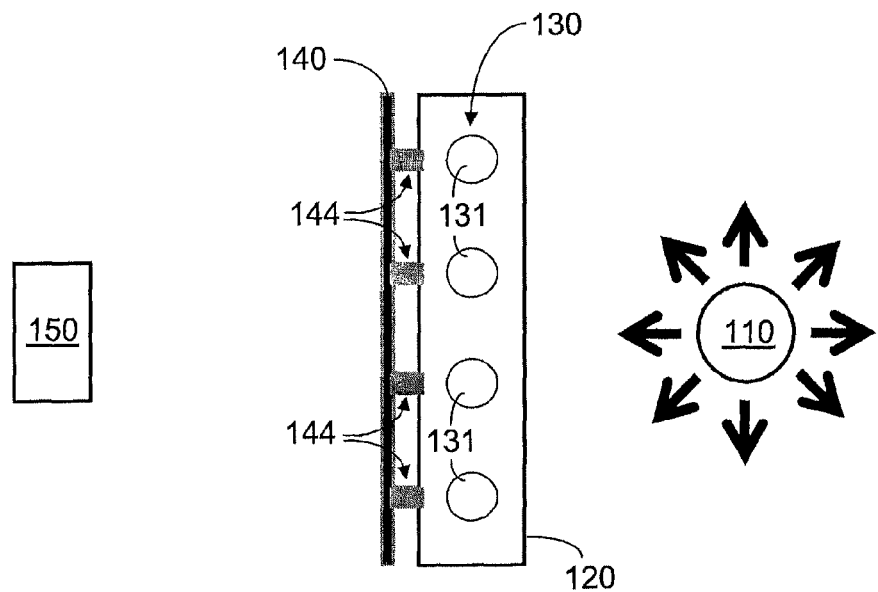
FIGS. 1a-b show schematic illustrations for elucidating the construction of an optical arrangement according to the disclosure in accordance with a first embodiment.

The heat (symbolized by arrows in FIG. 1a) emitted by a heat source or a heat-emitting element 110, in particular an optical element such as e.g. a mirror in a projection exposure apparatus, is at least partly absorbed here by a (first) heat shield 120 in order to protect a temperature-sensitive component 150 (e.g. a sensor associated with a measuring structure in the projection exposure apparatus, for instance a position sensor for a mirror position) depicted merely by way of example.

The first heat shield 120 can be produced e.g. from aluminum or steel or some other material having a good thermal conductivity and is in mechanical (or physical) contact with a cooling device 130 including a heat sink, such as e.g. cooling channels or cooling pipes, 131. A cooling medium, e.g. water having an initial temperature of 22° C., for example, flows through the cooling pipes 131 and the latter are connected to an external cooling device and dissipate the heat absorbed by the first heat shield 120 toward the outside via the cooling circuit thus created.

In order to realize the schematically illustrated arrangement from FIGS. 1a, b, the cooling pipes 131 can be welded, for example, onto the first heat shield 120. Alternatively, particularly if welding is not possible for technological reasons appertaining to structural space, the cooling pipes 131 can also be milled into the first heat shield 120 (which should then be designed with a sufficient sheet thickness).

The arrangement has at least one second heat shield 140, which at least partly absorbs heat emitted by the first heat shield 120 and, in the exemplary embodiment, is in mechanical or physical contact only with the first cooling device 130, but for the rest has no physical contact with the first heat shield 120.

The material of the second heat shield and also of the cooling pipes can likewise be e.g. aluminum or steel or some other material having a good thermal conductivity.

Without restricting the disclosure thereto it is possible for exemplary thicknesses of the first and also of the second heat shields to be in the millimeter range (e.g. 1-3 mm), for instance, and, likewise merely by way of example, it is possible for the diameters of the cooling pipes 131 to be in the range of 5-10 mm. In this case, with the heat input remaining constant, the thickness of the first and also of the second heat shields 120, 140 can be chosen to be all the smaller, the smaller the distance between the cooling pipes 131, since, in the case of closely adjacent cooling pipes 131, the heat dissipation is still sufficiently effective even via smaller cross-sectional areas or sheet thicknesses.

Figure 1B:
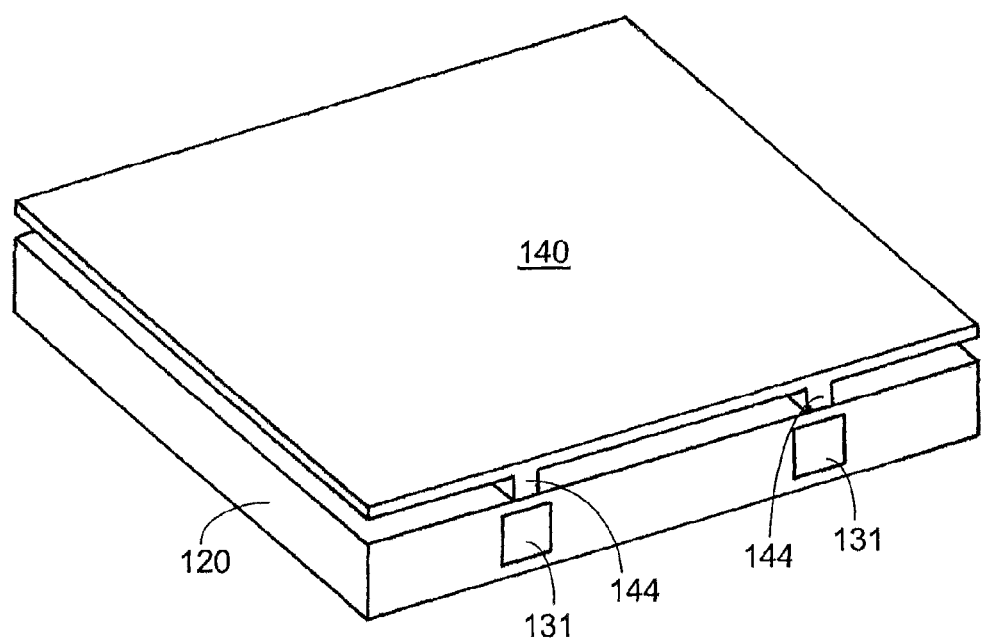

As can be seen from the perspective illustration in FIG. 1b, the second heat shield 140 in the exemplary embodiment illustrated has a substantially plate-shaped geometry. Without restricting the disclosure thereto, in this case in the exemplary embodiment the second heat shield 140 covers the first heat shield 120 with constant (alternatively also varying) gap spacing, the mechanical connection of the second heat shield 140 to the cooling pipes 131 of the cooling device 130 being indicated by webs 144. In practice, the second heat shield 140 can be soldered onto the cooling pipes 131 or that region of the first heat shield 130 which is in direct contact with the cooling pipes 131, in order to produce a good thermal contact, or can be cohesively connected in some other way.

Figure 2A:
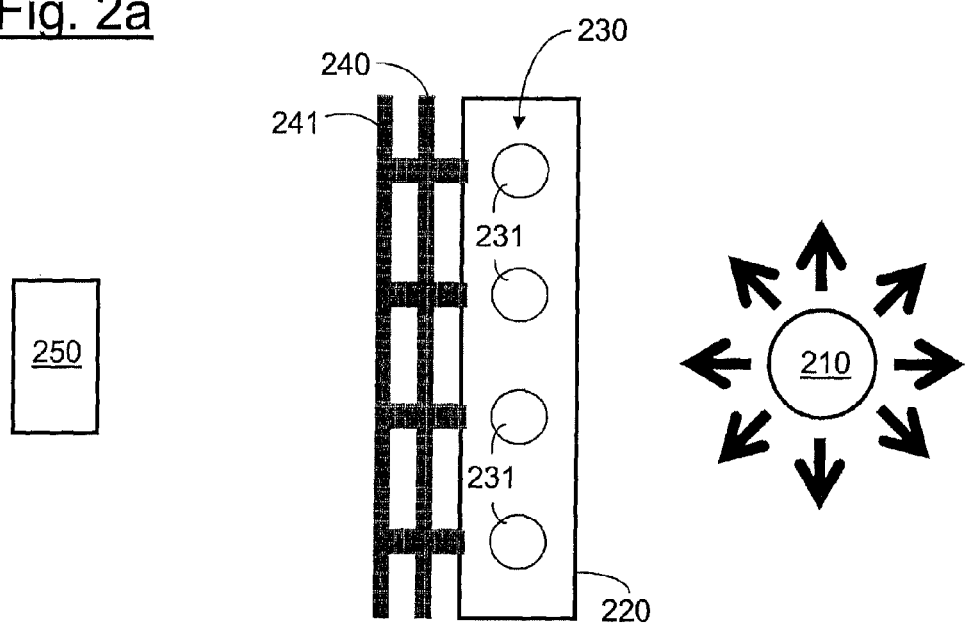
Figure 2B:
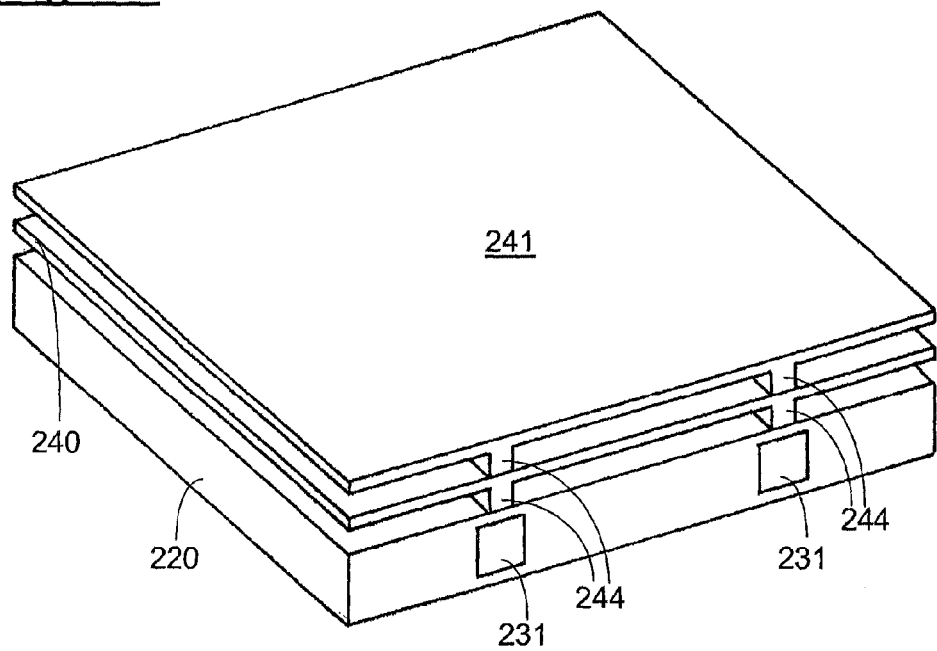

FIGS. 2a-b show a schematic illustration for elucidating a second embodiment, elements which correspond or are substantially functionally identical to the embodiment from FIGS. 1a-b being identified by reference symbols increased by 100.

The arrangement from FIGS. 2a-b differs from that from FIGS. 1a-b in that, in addition to the second heat shield 240, a third heat shield 241 is provided, which, for its part, is arranged at a (in the example once again constant) distance from the second heat shield 240 and is likewise in thermal contact with the cooling pipes 231 only via webs.

Figure 3:
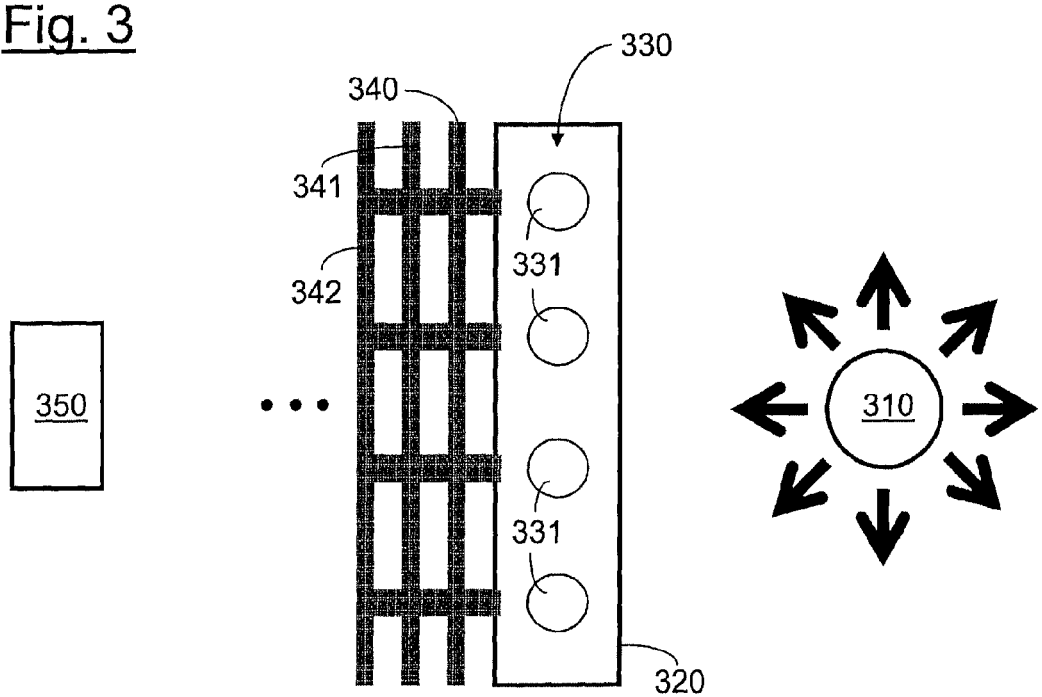

FIG. 3 shows a third embodiment in a likewise schematic illustration, elements which substantially correspond or are functionally identical to the embodiment from FIGS. 2a-b in turn being identified by reference symbols increased by 100. The arrangement from FIG. 3 differs from that from FIGS. 2a-b in the presence of a fourth shield 342, which, for its part, is arranged at a (in the example once again constant) distance from the third shield 341.

It should be pointed out that in the above-described and further embodiments, the heat shields need not necessarily face the temperature-sensitive component. In particular, the heat shields can also be arranged such that they face the respective heat-emitting subsystem.

The FEM simulations (FEM=Finite Elements Method) illustrated in FIGS. 9-12, and in each case illustrating the isotherms of the temperature increase, serve for illustrating the effects achieved by the arrangements according to the disclosure from FIGS. 1a-b and 2a-b, respectively.

Figure 9A:
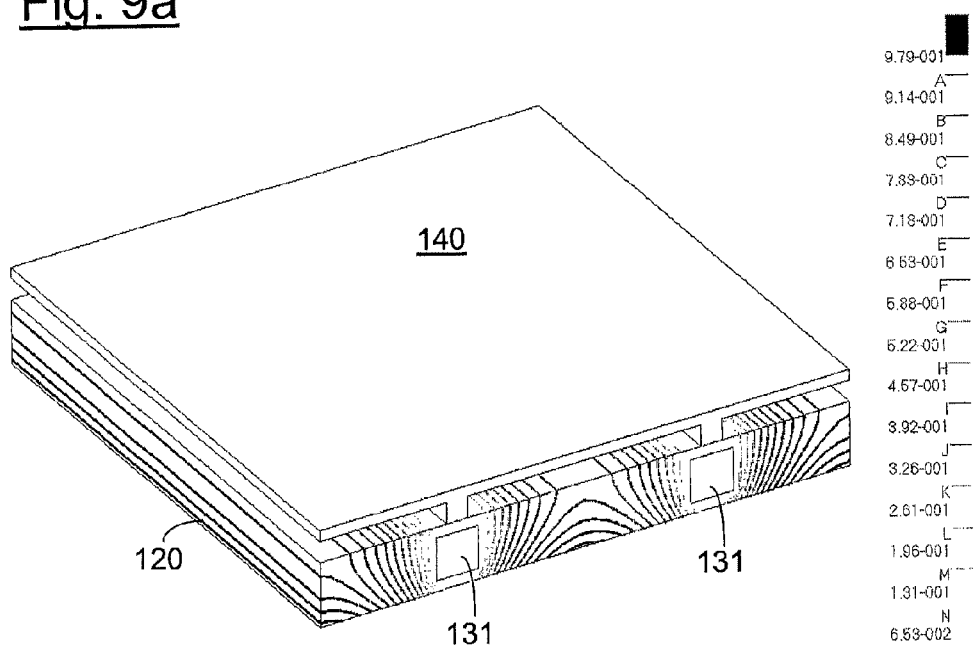
FIGS. 9a-12b show results of FEM simulations for illustrating temperature increases of the effects achieved according to the disclosure in an air atmosphere (FIGS. 9a-10b) and in an atmosphere composed of a low-pressure gas (FIGS. 11a-12b), to be precise both for the first embodiment (FIGS. 9a-b and FIGS. 11a-b) from FIG. 1 and for the second embodiment (FIGS. 10a-b and FIGS. 12a-b) from FIG. 2.
Figure 9B:
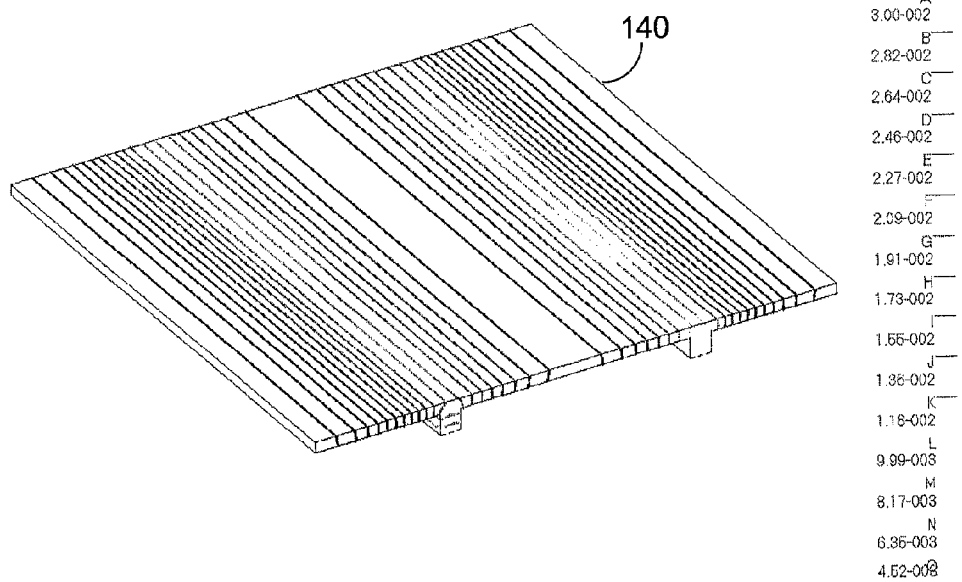

Specifically, FIG. 9a shows the temperature distribution in the first heat shield 120 for the case of an air atmosphere surrounding the arrangement from FIGS. 1a, b. FIG. 9b shows, with a correspondingly smaller scale, the temperature distribution that arises in the second heat shield 140. In this case, here as well as in the further illustrations in FIGS. 10-12, the heat-emitting subsystem (not illustrated) is respectively situated at the bottom in the drawing, that is to say—on the basis of the example from FIG. 9a—on that side of the first heat shield 120 which lies opposite or faces away from the second heat shield 140.

It can be seen that the second heat shield 140 leads to significantly more effective absorption of the heat emitted by the heat source or the heat-emitting element 110 (e.g. the optical element), in which case the temperature distribution that results in the second heat shield 140 in accordance with FIG. 9b, by comparison with that in the first heat shield in accordance with FIG. 9a, is both reduced in terms of the absolute values and has a smaller temperature fluctuation, that is to say in this respect also has a more homogeneous profile.

Figure 10A:
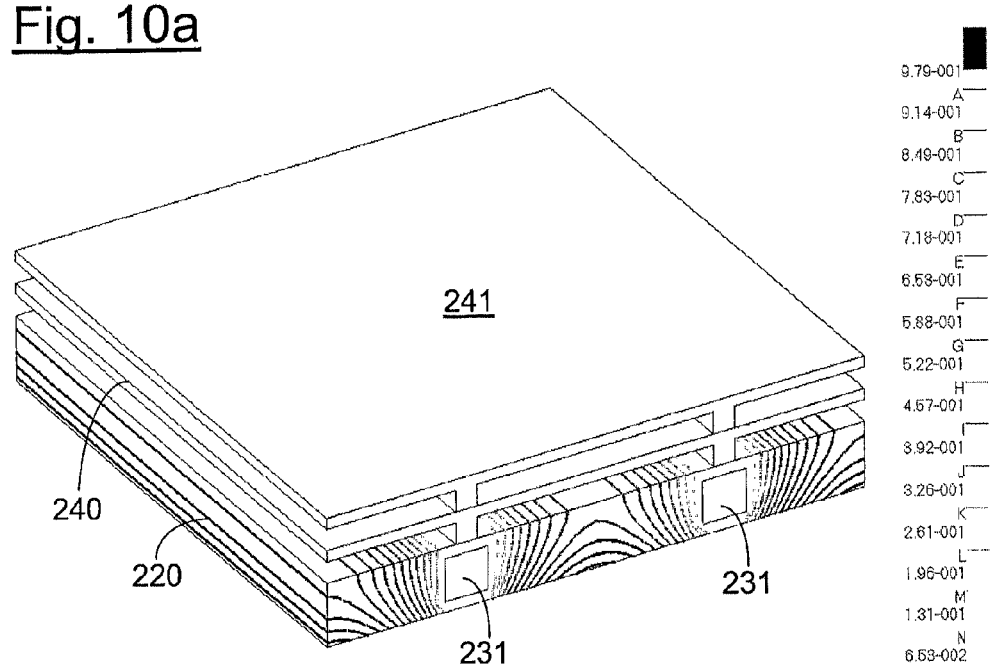
Figure 10B:
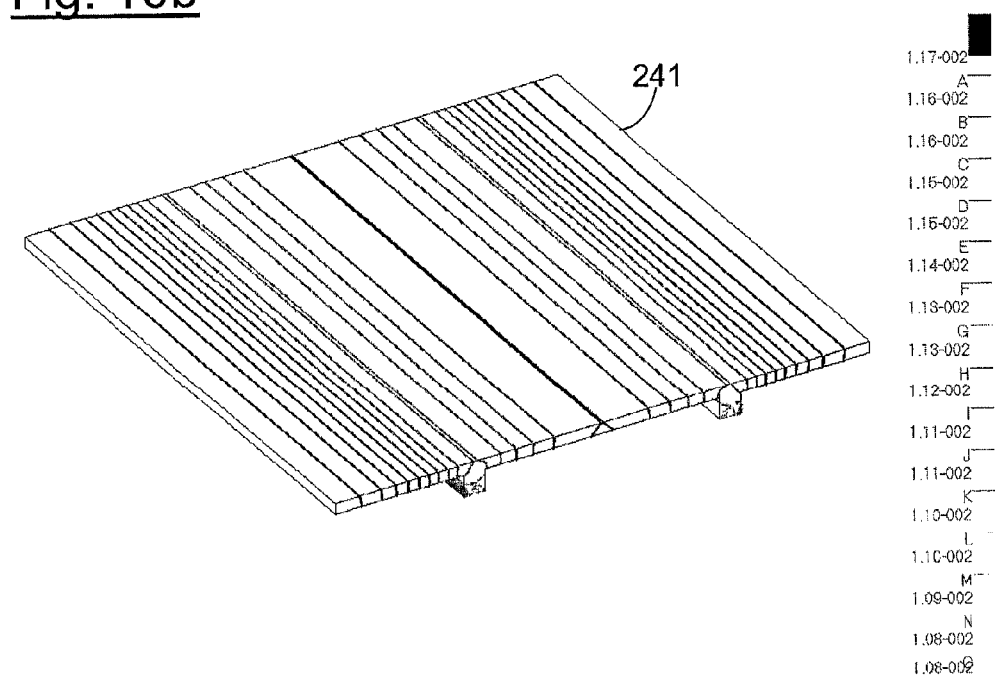
Figure 11A:
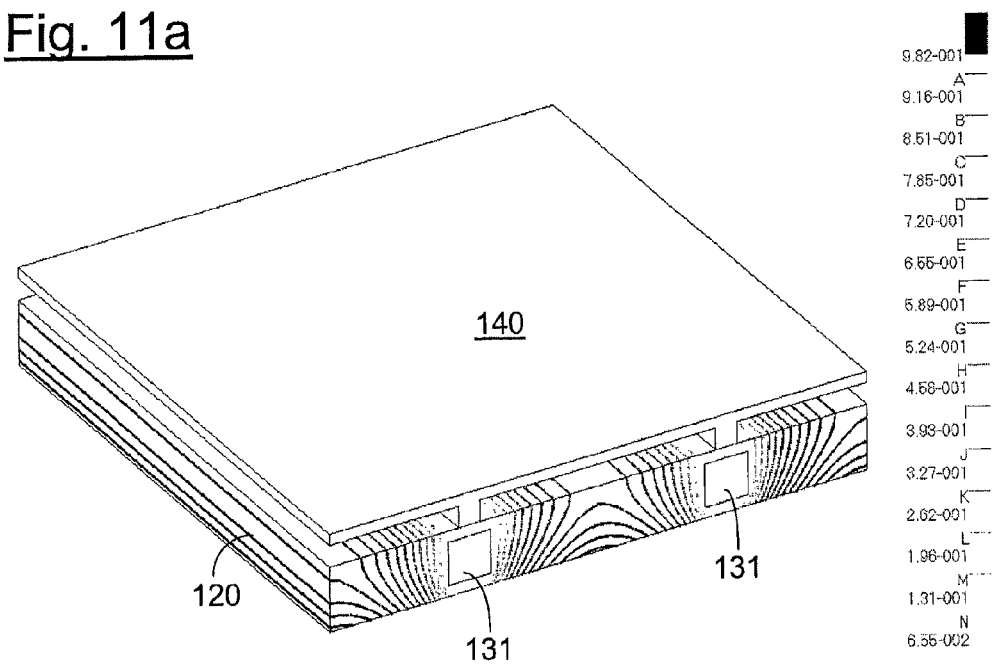
Figure 11B:
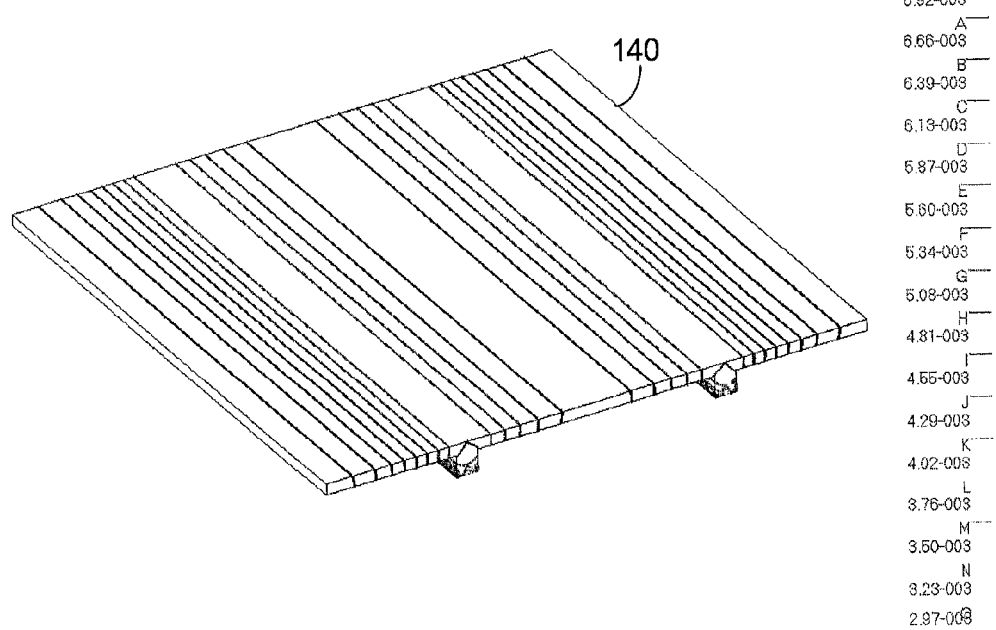
Figure 12A:
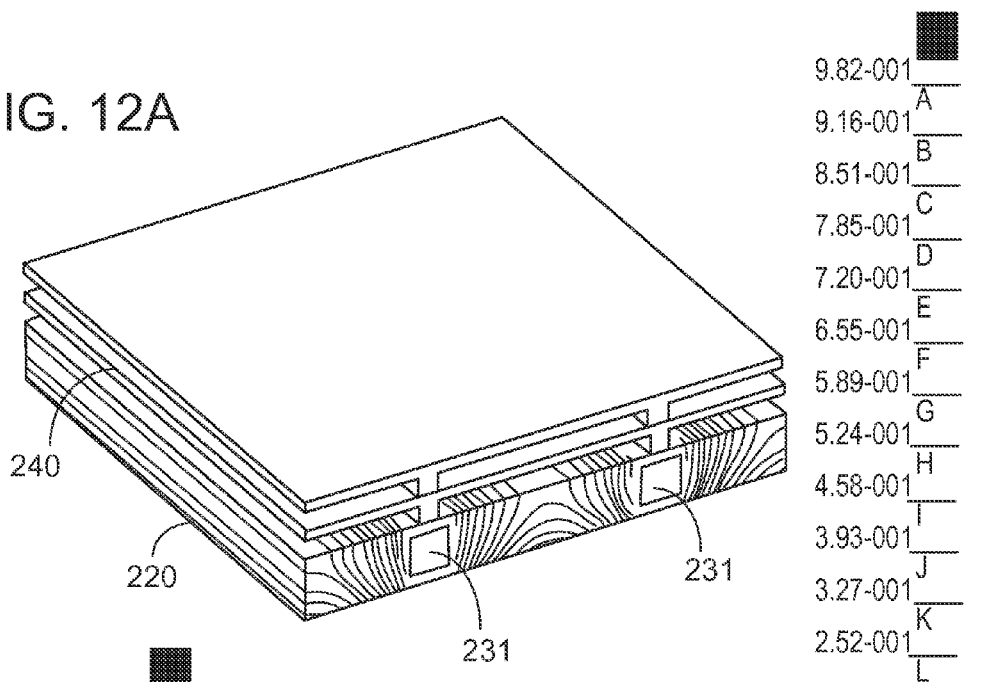
Figure 12B:
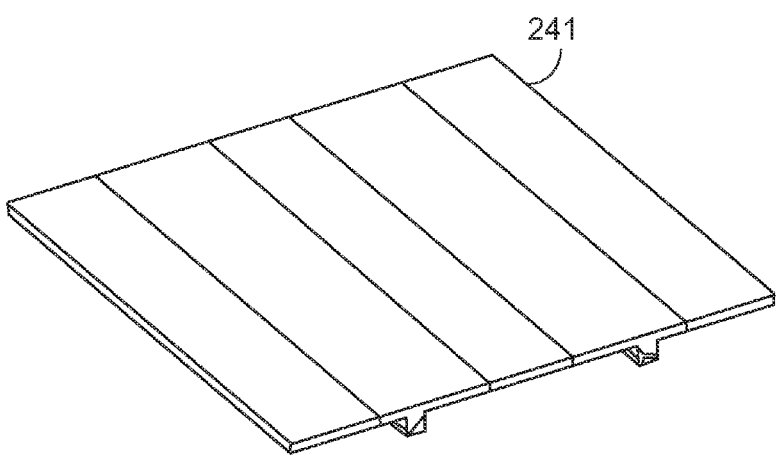

This effect can be increased again in accordance with FIGS. 10a-b for the arrangement from FIGS. 2a-b including a total of three heat shields 220, 240 and 241. In this case, it should be taken into consideration that FIG. 10b already shows the temperature distribution obtained in the topmost (that is to say third) heat shield 241, the temperature distribution being plotted with an even smaller scale in comparison with FIG. 9b.

FIGS. 11a-b and FIGS. 12a-b show the results analogous to FIGS. 9-10 for the corresponding arrangements in an atmosphere composed of a gas having a poorer conductivity or a low-pressure gas having, for example, a tenth of the thermal conductivity in comparison with the surroundings.

A comparison of the temperature distributions in FIGS. 11a-b and FIGS. 12a-b with the results in the case of an air atmosphere from FIGS. 9-10 shows a further improvement in the heat absorption or homogenization by the second and third heat shields 240 and 241, respectively. In this case, the use of a suitable low-pressure purge gas, in comparison with air, has the advantage that the distances between the plate-shaped heat shields 220, 240 and 241 can be chosen to be smaller since the thermal resistance in the gas has a smaller dependence on the distance between the heat shields.

Figure 4A:
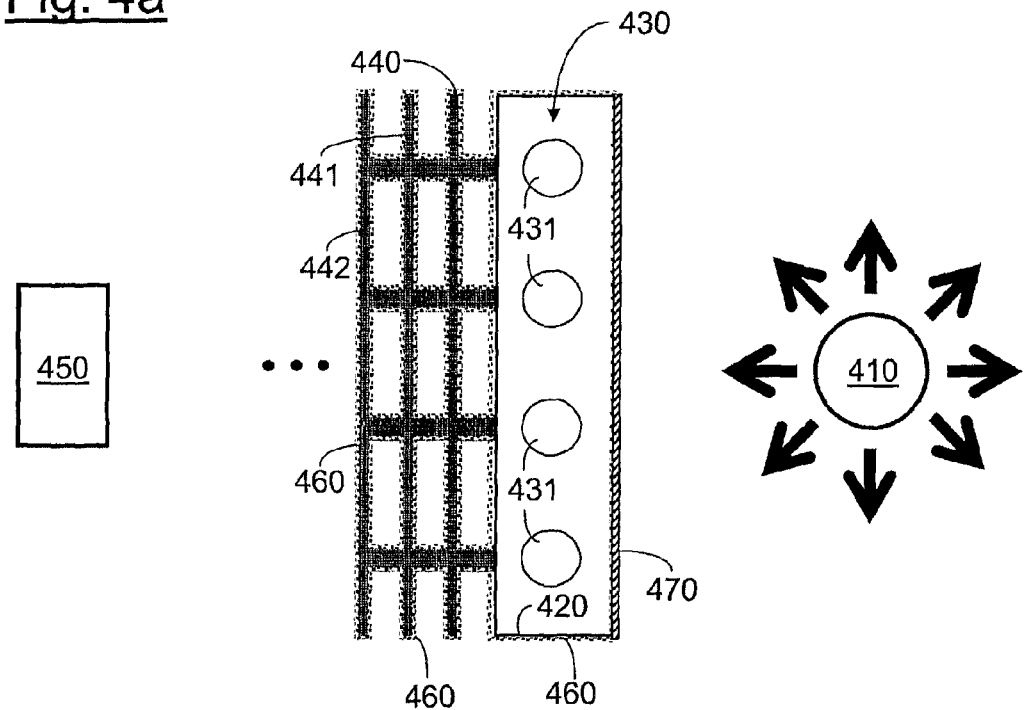

FIG. 4a shows a schematic illustration for elucidating a further embodiment of the disclosure, elements which correspond or are substantially functionally identical in comparison with FIG. 3 in turn being identified by reference symbols increased by 100.

The arrangement from FIG. 4a differs from that from FIG. 3 in that firstly the first heat shield 420 has, on its side facing the heat source or the heat-emitting element 410 (e.g. the optical element), a coating 470 that increases the emissivity, preferably with an emissivity of at least 0.5, in particular at least 0.8, more particularly at least 0.95. Secondly, the remaining surfaces of the heat shields 420, 440, 441 and 442 are provided with a coating 460 that reduces the emissivity (preferably with an emissivity of less than 0.5, in particular less than 0.2, more particularly less than 0.05).

Figure 4B:
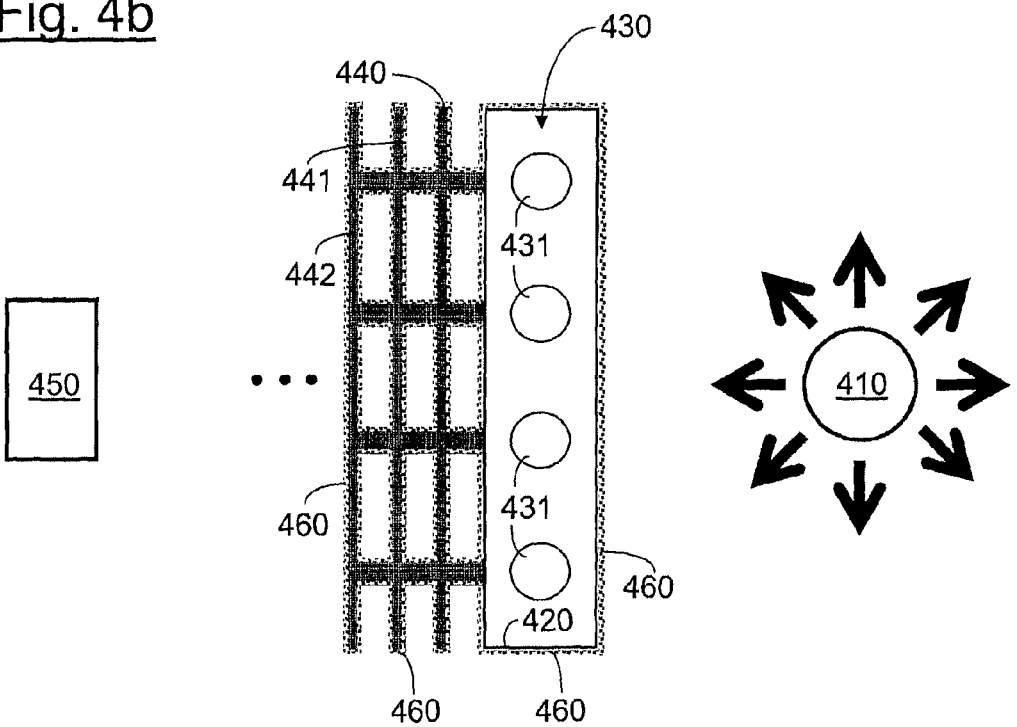

In accordance with a further alternative embodiment, illustrated in FIG. 4b, a coating 460 that reduces the emissivity can also be provided on that side of the first shield 420 which faces the heat-emitting element 410.

In the embodiments described with reference to FIG. 4 as well, the heat shields can alternatively also face the respective heat-emitting subsystem, in which case, if appropriate, the position of the respective coatings should then be adapted in accordance with the changed arrangement.

Figure 5:
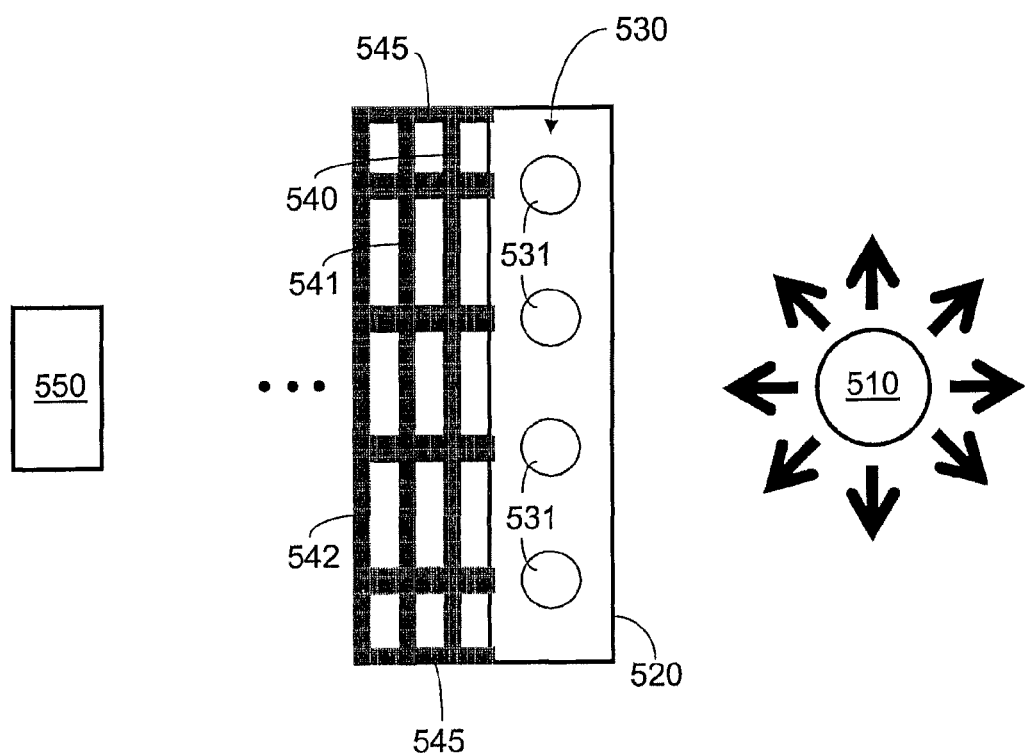

FIG. 5 shows a schematic illustration for elucidating a further embodiment, elements which are substantially functionally identical in comparison with FIG. 4a in turn being provided with reference symbols increased by 100.

In contrast to the embodiments described above, in accordance with FIG. 5, regions or partial housings with their own vacuum environment, within which the atmosphere differs from that in the surroundings of the arrangement, are formed by the heat shields 520, 540, 541 and 542 through the creation of a closed design with peripheral walls 545. In particular, a vacuum or a gas having a poorer thermal conductivity compared with the surrounding atmosphere can be present in the partial housings or regions defined by the heat shields in conjunction with the outer wall 545.

Figure 6A:
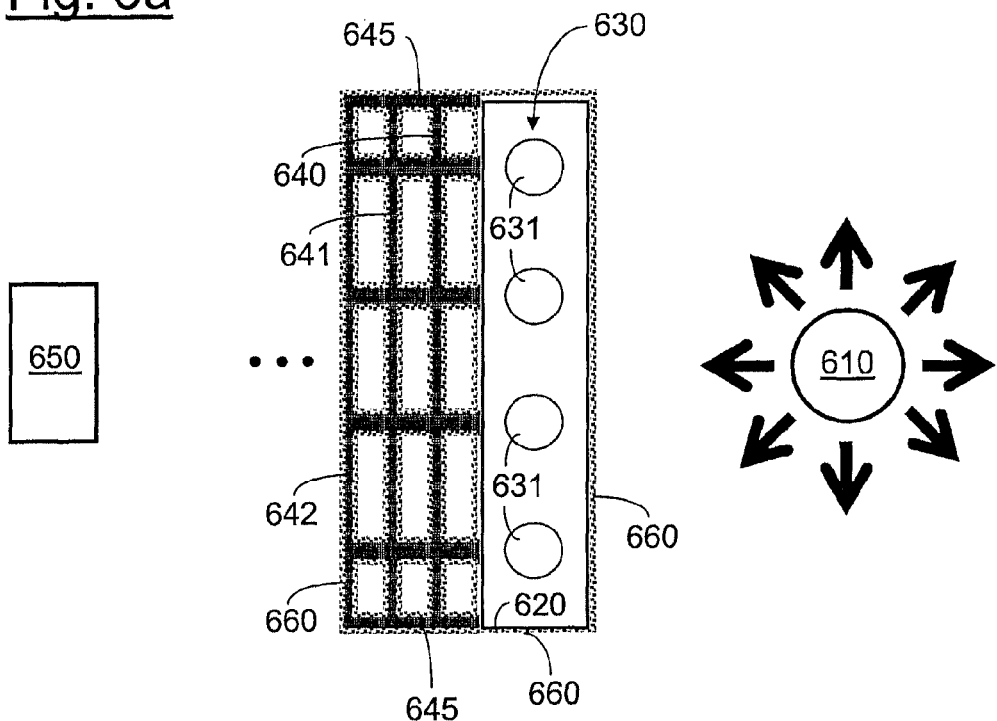
Figure 6B:
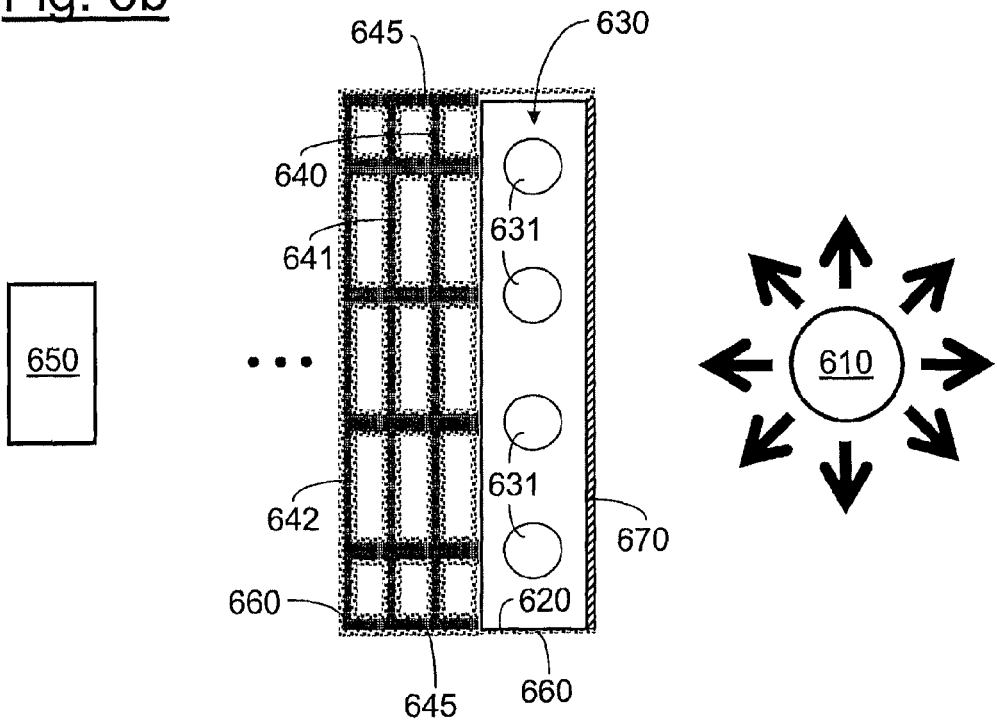

As is indicated in FIGS. 6a and 6b, the closed design from FIG. 5 can also be combined with the coatings from FIGS. 4a and 4b, respectively. In this respect, FIG. 6a shows an arrangement in which all areas of the heat shields 620, 640, 641 and 642 are provided with a coating 660 that reduces the emissivity, and FIG. 6b shows an arrangement in which, analogously to FIG. 4a, a coating 670 that increases the emissivity is provided on that side of the first heat shield 620 which faces the heat-emitting element 610.

In the embodiments described with reference to FIGS. 5 and 6 as well, the heat shields can alternatively also face the respective heat-emitting subsystem, in which case, if appropriate, the position of coatings should be adapted in accordance with the changed arrangement.

As illustrated in FIG. 7, the second heat shield 740 can also be configured such that it surrounds the first heat shield 720 substantially in a box- or hood-like manner, for which purpose the second heat shield 740 is composed of sections 740a, 740b and 740c extending in different spatial directions (perpendicular to one another in the example). In the exemplary embodiment shown, the first heat shield 720 also has an analogous box- or hood-like geometry surrounding the region of the heat-emitting element 710. The embodiment illustrated in FIG. 7 leads to even more effective absorption of the heat emitted by the heat-emitting element 710, that is to say as it were to a further reduction of the externally visible temperature distribution caused by the heating of the heat-emitting element 810, and is advantageous particularly in the illustrated situation in which not just one, but a plurality of temperature-sensitive components 750, 751, 752, . . . are present at different positions in the optical system.

In further embodiments (not illustrated), the box- or hood-like geometry can also surround the temperature-sensitive component to be protected, which is advantageous for example when a plurality of (in particular widely spread) heat sources or one or a plurality of—relative to the temperature-sensitive component—comparatively large heat sources or a heat-emitting subsystem are present. Furthermore, in modifications of the above-described embodiments with a box- or hood-like geometry, the heat shields or sheets can also be arranged on the inside in the respective hood-like arrangement, that is to say, for instance, in accordance with FIG. 7, between the heat-emitting element 710 and the arrangement of cooling pipes 731.

Figure 8A:
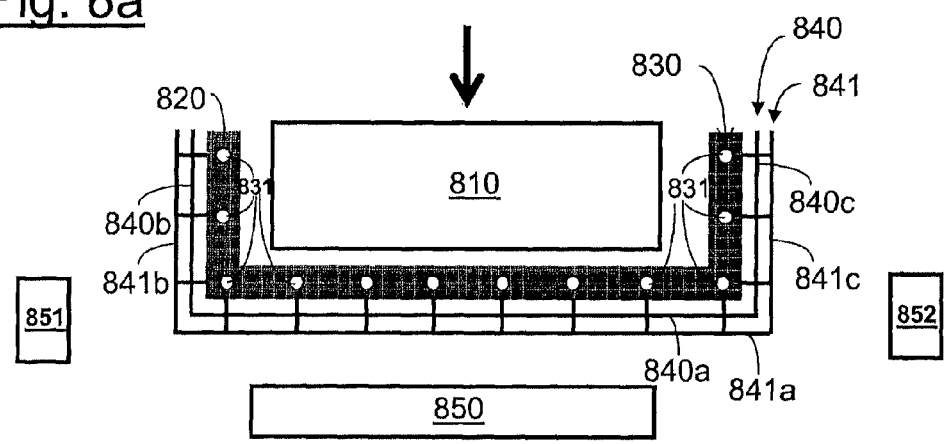
Figure 8B:
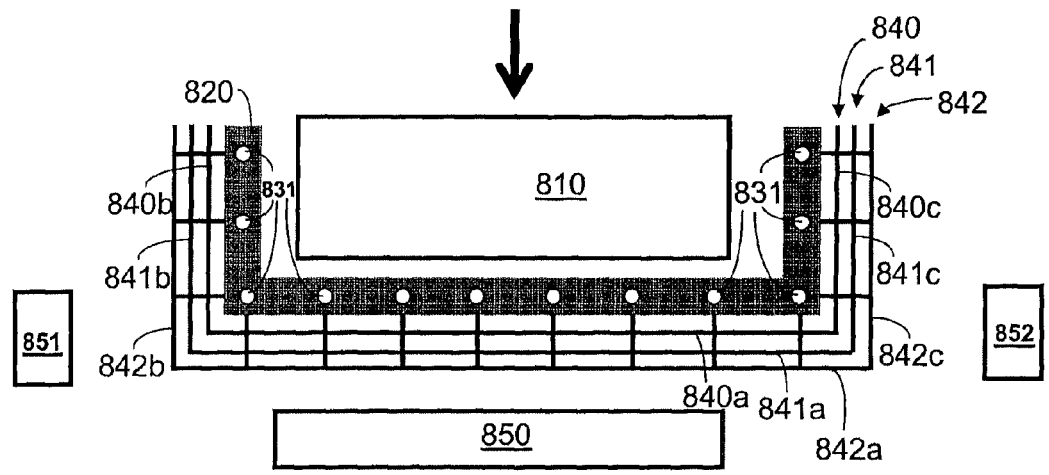

FIGS. 8a and 8b show schematic illustrations with arrangements analogous to FIG. 7, wherein not just two heat shields 820 and 840 but additionally a third heat shield 841 (FIG. 8a) and, respectively, a third and fourth heat shield 841 and, respectively, 842 (FIG. 8b) are arranged in an analogous manner. In accordance with further embodiments (not illustrated), any desired higher number of heat shields can also be provided.

Figure 13:
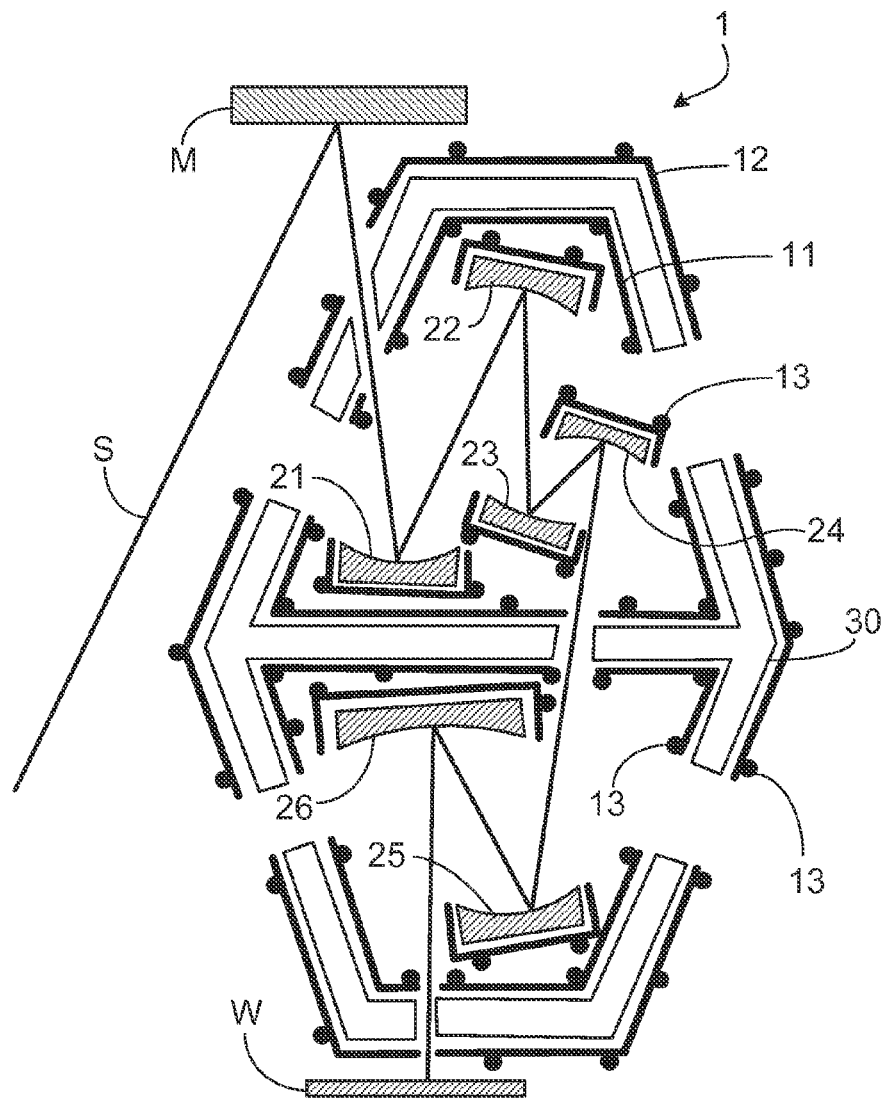
FIG. 13 shows a schematic illustration of the construction of a projection objective designed for EUV in accordance with the prior art.

FIG. 13 shows, in a schematic illustration, an exemplary construction of a projection objective 1 of a projection exposure apparatus designed for EUV. The projection objective 1 is constructed from six mirrors 21-26 and can have e.g. a magnification factor of 1:4. In FIG. 13, the beam path 7 runs non-telecentrically on the object side (that is to say on the reticle side or mask M side), and runs telecentrically on the image plane side (that is to say on the wafer W side). In the example shown, all of the mirrors 21-26 are concave mirrors. However, the disclosure is not restricted to this configuration, but rather also encompasses configurations having a different number or configuration of the mirrors used. In accordance with FIG. 13, a radiation beam S proceeding from the mask M or reticle passes, after reflection at the mirrors 21-26, onto the wafer W in order to generate an image of the structure of the reticle M that is to be imaged.

Even though the disclosure has been described on the basis of specific embodiments, numerous variations and alternative embodiments are evident to the person skilled in the art, e.g. by combination and/or exchange of features of individual embodiments. Accordingly, a person skilled in the art would understand that such variations and alternative embodiments are also encompassed by the present disclosure, and the scope of the disclosure is restricted only within the meaning of the accompanying patent claims and the equivalents thereof.

What is claimed is:

1. An optical arrangement, comprising:
   a heat-emitting subsystem configured to emit heat during use of the optical arrangement;
   a first heat shield configured to at least partly absorb heat emitted by the heat-emitting subsystem;
   a first cooling device in mechanical contact with the first heat shield, the first cooling device being configured to dissipate heat from the first heat shield; and
   a second heat shield configured to at least partly absorb heat emitted by the first heat shield,
   wherein:
      the second heat shield is in mechanical contact with a cooling device configured to dissipate heat from the second heat shield; and
      wherein at least regions of one heat shield comprise a coating having emissivity of at most 0.5.

2. The optical arrangement of claim 1, wherein the second heat shield is not in mechanical contact with the first heat shield, or the second heat shield is in mechanical contact with the first heat shield only in the region of the first cooling device.

3. The optical arrangement of claim 1, wherein the cooling device that is in thermal contact with the second heat shield is a second cooling device separate from the first cooling device.

4. The optical arrangement of claim 3, wherein the first and the second cooling devices are connected to different cooling circuits.

5. The optical arrangement of claim 1, wherein the cooling device that is in thermal contact with the second heat shield is the first cooling device.

6. The optical arrangement of claim 1, wherein the optical arrangement comprises at least three heat shields.

7. The optical arrangement of claim 1, wherein the coating is arranged on a side of the one heat shield which faces away from the heat-emitting subsystem.

8. The optical arrangement of claim 1, wherein coating is arranged on a side of the one heat shield which faces the heat-emitting subsystem.

9. The optical arrangement of claim 1, wherein regions of the first heat shield comprise a coating having an emissivity of at least 0.5, and the coating is adapted for heat emitted by the heat-emitting subsystem.

10. The optical arrangement of claim 9, wherein the coating is arranged on a side of the first heat shield which faces the heat-emitting subsystem.

11. The optical arrangement of claim 1, comprising a plurality of heat shields comprising the first heat shield, wherein the plurality of heat shields define a partial housing with an atmosphere that differs from an atmosphere surrounding the optical arrangement.

12. The optical arrangement of claim 11, wherein gas contained in the partial housing has a poorer thermal conductivity than gas contained in an atmosphere surrounding the optical arrangement.

13. The optical arrangement of claim 11, wherein the plurality of heat shields comprises a second heat shield, and the second heat shield has a geometry corresponding to a geometry of the first heat shield.

14. The optical arrangement of claim 1, wherein the first heat shield surrounds at least three sides of the heat-emitting subsystem.

15. The optical arrangement of claim 1, further comprising the temperature-sensitive subsystem, wherein the first heat shield surrounds at least three sides of the temperature-sensitive subsystem.

16. The optical arrangement of claim 1, wherein the cooling device that is in thermal contact with the second heat shield is a second cooling device separate from the first cooling device, and the second heat shield surrounds at least three sides of the first heat shield.

17. The optical arrangement of claim 1, wherein the cooling device that is in thermal contact with the second heat shield is a second cooling device separate from the first cooling device, and the second heat shield is disposed above the first heat shield such that a width of the first heat shield overlaps a width of the second heat shield.

18. The optical arrangement of claim 1, wherein the heat-emitting subsystem is an optical subsystem.

19. The optical arrangement of claim 1, wherein the optical arrangement is configured to be used with operating wavelength of less than 400 nm.

20. A system, comprising:
    an optical arrangement according to claim 1,
    wherein the system is a microlithographic illumination device.

21. An apparatus, comprising:
    an illumination device; and
    a projection objective,
    wherein the apparatus is a microlithographic projection exposure apparatus, and the illumination device comprises an optical arrangement according to claim 1, and/or the projection objective comprises an optical arrangement according to claim 1.

22. A method of using a microlithographic projection exposure apparatus comprising an illumination device and a projection objective, the method comprising:
    using the projection objective to project at least a part of a mask onto a region of a light-sensitive material supported by a substrate,
    wherein the illumination device comprises an optical arrangement according to claim 1, and/or the projection objective comprises an optical arrangement according to claim 1.

23. An optical arrangement, comprising:
    a heat-emitting subsystem configured to emit heat during use of the optical arrangement;
    a first heat shield having a first width and a first length configured to at least partly absorb heat emitted by the heat-emitting subsystem;
    a first cooling device in mechanical contact with the first heat shield, the first cooling device being configured to dissipate heat from the first heat shield; and
    a second heat shield having a second width and a second length configured to at least partly absorb heat emitted by the first heat shield,
    wherein:
       the second heat shield is in mechanical contact with a cooling device configured to dissipate heat from the second heat shield;
       the second width is greater than or equal to the first width;

the second length is greater than or equal to the first length;

the second heat shield comprises aluminum or steel; and at least regions of one heat shield comprise a coating having emissivity of at most 0.5.

* * * * *